United States Patent
Milanesi et al.

(10) Patent No.: US 10,582,579 B1
(45) Date of Patent: Mar. 3, 2020

(54) SWITCHING-MODE POWER SUPPLY WITH COMPENSATION ADJUSTMENT

(71) Applicant: Infineon Technologies AG, Neubiberg (DE)

(72) Inventors: Paolo Milanesi, Padua (IT); Roberto Penzo, Vigonza (IT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/267,234

(22) Filed: Feb. 4, 2019

(51) Int. Cl.
| | |
|---|---|
| *H02M 3/158* | (2006.01) |
| *H05B 33/08* | (2020.01) |
| *G01R 19/165* | (2006.01) |
| *H02M 1/00* | (2006.01) |

(52) U.S. Cl.
CPC ... *H05B 33/0818* (2013.01); *G01R 19/16528* (2013.01); *H02M 3/1584* (2013.01); *H02M 2001/0009* (2013.01)

(58) Field of Classification Search
CPC ........ H02M 3/1584; H02M 2001/0009; H05B 33/0818; G01R 19/16528
See application file for complete search history.

(56) References Cited

U.S. PATENT DOCUMENTS

2006/0279228 A1* 12/2006 Kato ................. H05B 33/0815
315/193

* cited by examiner

*Primary Examiner* — Adolf D Berhane
*Assistant Examiner* — Afework S Demisse
(74) *Attorney, Agent, or Firm* — Shumaker & Sieffert, P.A.

(57) ABSTRACT

A controller circuit for controlling a switching-mode power supply (SMPS) is configured to receive a load control signal indicating an on state when a load is to be coupled to the SMPS and an off state when the load is not to be coupled to the SMPS. In response to the load control signal transitioning from the on state to the off state, the controller circuit is configured to generate a first measured input voltage. In response to the load control signal transitioning from the off state to the on state, the controller circuit is configured to generate a second measured input voltage. The controller circuit is configured to drive a compensation voltage at a compensation element using the first measured input voltage and the second measured input voltage and selectively switch the SMPS using the compensation voltage after driving the compensation voltage.

20 Claims, 12 Drawing Sheets

US 10,582,579 B1

SWITCHING-MODE POWER SUPPLY WITH COMPENSATION ADJUSTMENT

TECHNICAL FIELD

This disclosure relates a switching-mode power supply (SMPS), such as, for example, a buck converter, boost converter, or buck-boost converter.

BACKGROUND

A duty cycle of a switching-mode power supply (SMPS) may be controlled to regulate a voltage, current, or power supplied to a load. For example, a SMPS can be configured charge an inductive element with a supply only when a voltage at a sawtooth wave is greater than a compensation voltage. In this way, increasing the compensation voltage increases the voltage, current, or power supplied to the load and decreasing the compensation voltage decreases the voltage, current, or power supplied to the load.

SUMMARY

In general, this disclosure is directed to techniques for reducing an overshoot and/or undershoot of a voltage, current, or power supplied by a switching-mode power supply (SMPS) to a load. For example, a controller circuit may drive a compensation voltage using a first measured input voltage generated when the load is switched out and a second measured input voltage generated when the load is switched in. In this way, the controller circuit may drive the compensation voltage to account for a change in input voltage to help to minimize an overshoot and/or undershoot of a voltage, current, or power supplied by the SMPS to the load.

In an example, a controller circuit for controlling a SMPS is configured to: receive a load control signal indicating an on state when a load is to be coupled to the SMPS and an off state when the load is not to be coupled to the SMPS; in response to the load control signal transitioning from the on state to the off state, generate a first measured input voltage corresponding to an input voltage at the SMPS; in response to the load control signal transitioning from the off state to the on state, generate a second measured input voltage corresponding to the input voltage at the SMPS; drive a compensation voltage at a compensation element using the first measured input voltage and the second measured input voltage; and selectively switch the SMPS using the compensation voltage after driving the compensation voltage.

In another example, a method for controlling a SMPS includes: receiving, by a controller circuit, a load control signal indicating an on state when a load is to be coupled to the SMPS and an off state when the load is not to be coupled to the SMPS; in response to the load control signal transitioning from the on state to the off state, generating, by the controller circuit, a first measured input voltage corresponding to an input voltage at the SMPS; in response to the load control signal transitioning from the off state to the on state, generating, by the controller circuit, a second measured input voltage corresponding to the input voltage at the SMPS; driving, by the controller circuit, a compensation voltage at a compensation element using the first measured input voltage and the second measured input voltage; and selectively switching, by the controller circuit, the SMPS using the compensation voltage after driving the compensation voltage.

In another example, system includes: a set of light emitting diodes (LEDs); a SMPS; and a controller circuit configured to: receive a load control signal indicating an on state when the set of LEDs is to be coupled to the SMPS and an off state when the set of LEDs is not to be coupled to the SMPS; in response to the load control signal transitioning from the on state to the off state, generate a first measured input voltage corresponding to an input voltage at the SMPS; in response to the load control signal transitioning from the off state to the on state, generate a second measured input voltage corresponding to the input voltage at the SMPS; drive a compensation voltage at a compensation element using the first measured input voltage and the second measured input voltage; and selectively switch the SMPS using the compensation voltage after driving the compensation voltage.

Details of these and other examples are set forth in the accompanying drawings and the description below. Other features, objects, and advantages will be apparent from the description and drawings, and from the claims.

DETAILED DESCRIPTION

Figure 1:
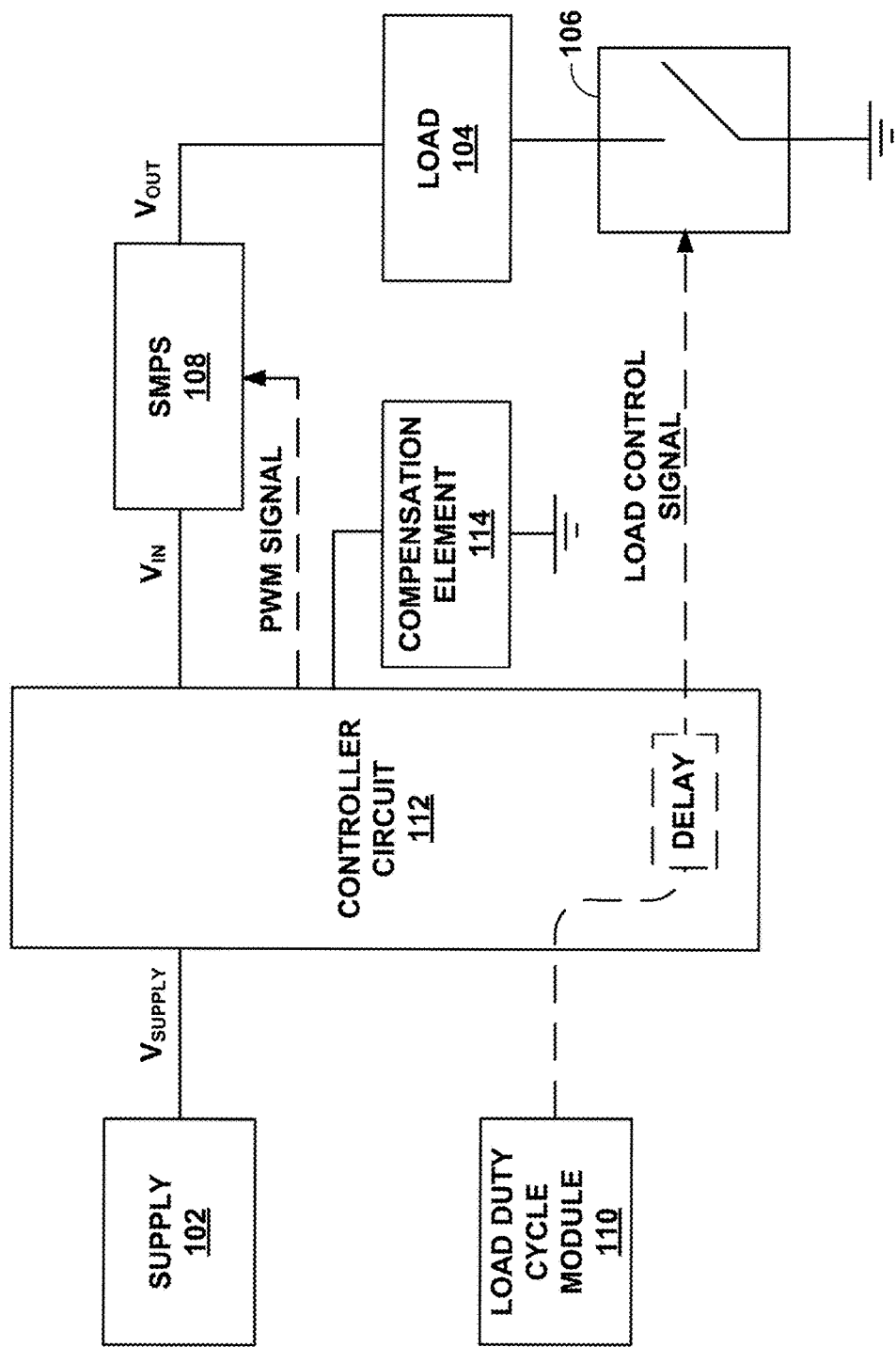
FIG. 1 is a block diagram illustrating an example system, in accordance with one or more techniques of this disclosure.

This disclosure is directed to techniques for reducing an overshoot and/or undershoot of a voltage, current, or power supplied by a switching-mode power supply (SMPS) to a load. For example, a controller circuit may drive a compensation voltage using a first measured input voltage generated when the load is switched out and a second measured input voltage generated when the load is switched in. In this way, the controller circuit may drive the compensation voltage to account for a change in input voltage to help to minimize an overshoot and/or undershoot of a voltage, current, or power supplied by the SMPS to the load. The techniques and controller circuits described herein may be useful in a wide variety of SMPS applications, and may be especially useful in automotive applications.

In an example automotive application, for example, a light emitting diode (LED) driver may switch in and switch out a set of LEDs using a load control signal (e.g., a pulse-width modulated (PWM) signal) having a desired duty cycle. When the set of LEDs is switched in, the LED driver may drive a compensation voltage to regulate a current at the set of LEDs. For example, the LED driver may increase a compensation voltage at a compensation capacitor to increase a current at the set of LEDs when the current is less than a target current and may decrease the compensation voltage at the compensation capacitor to decrease a current at the set of LEDs when the current is greater than the target current. In this example, if an input voltage supplied to an SMPS changes when the set of LEDs is switched in, the LED driver may adjust the compensation voltage such that the current at the set of LEDs matches the target current.

However, to optimize a digital dimming performance, the driver LED may keep the compensation voltage constant when the set of LEDs is switched out. As such, if a voltage step on the input voltage occurs when the set of LEDs is switched out, a voltage, current, or power output by the SMPS may be too high or too low due to the input voltage step (e.g., increase or decrease) when the set of LEDs is switched in, which may result in an overshoot or undershoot in the voltage, current, or power output by the SMPS that may damage the set of LEDs and/or cause an undesirable visible flickering by the set of LEDs.

Furthermore, in an example case of a single inductor buck-boost DC-DC converter, the topology mode selection (e.g., Buck mode, Buck-Boost mode, Boost mode) is constant when the set of LEDs is switched out, which may exacerbate the overshoot or undershoot in the voltage, current, or power output by the SMPS when the switching activity starts with a wrong mode selected. For example, when the set of LEDs is switched in after a input voltage step decreases an input voltage from a voltage that is greater than an output voltage to a voltage that is less than the output voltage, a driver LED may initially operate the SMPS in Buck mode instead of Boost mode, which may result in a further undershoot in the voltage, current, or power output by the SMPS.

In accordance with techniques described herein, a controller circuit for controlling a SMPS may be configured to drive the compensation voltage and set an operating mode of the SMPS to respond to a change in input voltage step when the load is switched out, which may help to improve a performance of the load and protect the load against unwanted current spikes. For example, in the example automotive application, a controller circuit may be configured to drive the compensation voltage and set an operating mode of the SMPS to respond to a change in input voltage step when a set of LEDs is switched out, which may help to improve a digital dimming performance (e.g., dimming ratio) of the SMPS, and to protect the load against unwanted current spikes.

FIG. 1 is a block diagram illustrating an example system 100, in accordance with one or more techniques of this disclosure. As illustrated in the example of FIG. 1, system 100 may include supply 102, load 104, load switching module 106, SMPS 108, load duty cycle module 110, controller circuit 112, and compensation element 114. Compensation element 114 may include a capacitor. One or more of supply 102, load duty cycle module 110, controller circuit 112, or SMPS 108 may be implemented in a single integrated circuit (IC).

Supply 102 may be configured to provide electrical power to one or more other components of system 100. For instance, supply 102 may be configured to supply power to load 104. In some examples, supply 102 includes a battery which may be configured to store electrical energy. Examples of batteries may include, but are not limited to, nickel-cadmium, lead-acid, nickel-metal hydride, nickel-zinc, silver-oxide, lithium-ion, lithium polymer, any other type of rechargeable battery, or any combination of the same. In some examples, supply 102 may include an output of a linear voltage regulator, a power converter, or a power inverter. For instance, supply 102 may include an output of a DC to DC power converter, an alternating current (AC) to DC power converter, and the like. In some examples, supply 102 may represent a connection to an electrical supply grid. In some examples, the input power signal provided by supply 102 may be a DC input power signal. For instance, in some examples, supply 102 may be configured to provide a DC input power signal in the range of −5 $V_{DC}$ to −40 $V_{DC}$.

Load 104 may include one or more of a resistive load, a capacitive load, or an inductive load. In some examples, load 104 may include a set of LEDs (e.g., one or more LEDs). As used herein, LEDs may refer to any suitable semiconductor light source. In some examples, an LEDs may include a p-n junction configured to emit light when activated. In an exemplary application, load 104 may include one or more LEDs implemented in a headlight assembly, a taillight assembly, or another assembly for automotive applications. As used herein, a vehicle may refer to trucks, boats, golf carts, snowmobiles, heavy machines, or any type of vehicle that uses directional lighting.

Load switching module 106 may be configured to activate load 104. Load switching module 106 may include a switching element. For example, a switching element of load switching module 106 may couple a low side of load 104 to a negative node (e.g., ground) of supply 102 to permit power to flow from a positive node of supply 102, through SMPS 108 and load 104, to a negative node of of supply 102. Examples of switching elements may include, but are not limited to, a silicon-controlled rectifier (SCR), a Field Effect Transistor (FET), and a bipolar junction transistor (BJT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. Examples of BJTs may include, but are not limited to, PNP, NPN, heterojunction, or any other type of BJT, or any combination of the same. Switching elements may be high-side or low-side switching elements. Additionally, switching elements may be voltage-controlled and/or current-controlled. Examples of current-controlled switching elements may include, but are not limited to, gallium nitride (GaN) MOSFETs, BJTs, or other current-controlled elements.

Load duty cycle module 110 may be configured to generate a load control signal to drive load switching module 106. In some examples, load duty cycle module 110 may be a dimming module for a set of LEDs of load 104. In some examples, load duty cycle module 110 may include an analog circuit. In some examples, load duty cycle module 110 may be a microcontroller on a single integrated circuit containing a processor core, memory, inputs, and outputs. For example, load duty cycle module 110 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, load duty cycle module 110 may be a combination of one or more analog components and one or more digital components.

SMPS 108 may be configured to couple one or more storage elements to an input node ("$V_{IN}$") and to couple the one or more storage elements to an output node ("$V_{OUT}$"). Examples of storage elements may include, but are not limited to, for example, a capacitor, an inductor, or another storage element. For example, SMPS 108 may include a switching element configured to couple an inductor to the input node. In some examples, SMPS 108 may include multiple switching elements (see FIG. 6) configured to operate in multiple modes. For instance, SMPS 108 may be configured to operate in two or more of a buck mode, boost mode, or a buck-boost mode. In some examples, SMPS 108 may operate in one mode. For instance, SMPS 108 may be configured to only operate in buck mode.

Controller circuit 112 may be configured to control SMPS 108. For example, controller circuit 112 may be configured to drive a compensation voltage at compensation element 114 using two or more measured voltages (e.g., input voltage, output voltage, etc.) at SMPS 108 and/or a compensation voltage at compensation element 114. One or more of the measured voltages may be sampled, for example, using an analog-to-digital converter (ADC) and stored as digital information. In some examples, one or more of the measured voltages may each be stored, for example, as a voltage at a sampling capacitor. In some examples, controller circuit 112 may be configured to select an operating mode for SMPS 108. For example, controller circuit 112 may be configured to select a mode from a modes including buck mode, boost mode, or buck-boost mode.

In some examples, controller circuit 112 may include an analog circuit. In some examples, controller circuit 112 may be a microcontroller on a single integrated circuit containing a processor core, memory, inputs, and outputs. For example, controller circuit 112 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. In some examples, controller circuit 112 may be a combination of one or more analog components and one or more digital components.

Controller circuit 112 may selectively switch SMPS 108 using the compensation voltage. For example, controller circuit 112 may selectively switch a switching element of SMPS 108 to couple an inductor to the input node of SMPS 108 based on a comparison of the compensation voltage at compensation element 114 and a sawtooth waveform. In some examples, controller circuit 112 may receive a first load control signal for driving load switching module 106 from load duty cycle module 110 and output a second load control signal to drive load switching module 106. In some examples, controller circuit 112 may generate the second load control signal to correspond to the first load control signal with a delay.

In accordance with one or more techniques, controller circuit 112 may be configured to receive a load control signal from load duty cycle module 110 indicating an on state when load 104 is to be coupled to SMPS 108 and an off state when load 104 is not to be coupled to SMPS 108. In response to the load control signal transitioning from the on state to the off state, controller circuit 112 may be configured to generate a first measured input voltage corresponding to an input voltage at SMPS 108. In response to the load control signal transitioning from the off state to the on state, controller circuit 112 may be configured to generate a second measured input voltage corresponding to the input voltage at SMPS 108. Controller circuit 112 may be configured to drive a compensation voltage at compensation element 114 using the first measured input voltage and the second measured input voltage and selectively switch SMPS 108 using the compensation voltage at compensation element 114 after driving the compensation voltage.

Figure 2:
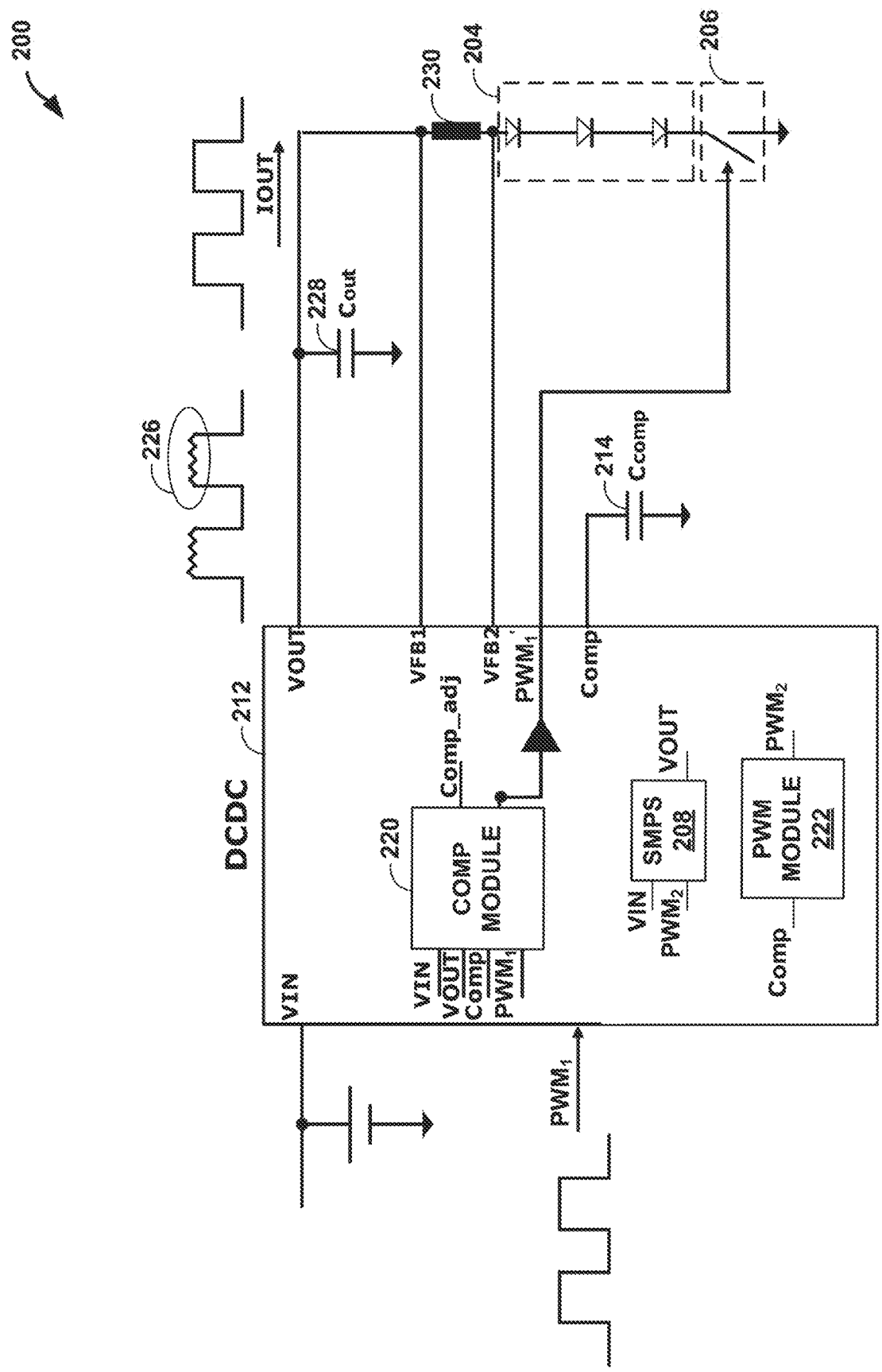
FIG. 2 is a conceptual diagram illustrating an example first circuit of the system of FIG. 1, in accordance with one or more techniques of this disclosure.

FIG. 2 is a conceptual diagram illustrating an example first circuit 200 of system 100 of FIG. 1, in accordance with one or more techniques of this disclosure. As illustrated, circuit 200 includes set of LEDs 204, load switching module 206, controller circuit 212, and compensation capacitor 214, which may be examples of load 104, load switching module 106, controller circuit 112, and compensation element 114 of FIG. 1. Controller circuit 212 may include SMPS 208, compensation module 220 ("comp module 220"), and PWM module 222. Although the example of FIG. 2 uses a capacitor as a compensation element other compensation elements may be used.

In the example of FIG. 2, the load control signal may be a first PWM signal ("PWM1") at a first frequency. In this example, controller circuit 212 is configured to generate a second PWM signal ("PWM2") at a second frequency for switching SMPS 208. The second frequency may be greater than the first frequency. For instance, the first frequency of the first PWM signal for driving load switching module 206 may be between 50 Hz and 1 kHz. In some instances, the second frequency of the second PWM signal for driving SPMS 208 may be between 1 kHz and 100 kHz. For example, FIG. 2 illustrates ripple 226 from the second PWM signal, which is filtered by output capacitor 228 ("Cout").

PWM module 222 may be configured to generate the second PWM signal with a duty cycle that corresponds to the compensation voltage at compensation capacitor 214. For example, PWM module 222 may generate the second PWM signal using a comparison of the compensation voltage of compensation capacitor 214 with a reference signal (e.g., sawtooth signal) and output, to SMPS 208, the second PWM signal. More specifically, PWM module 222 may generate the second PWM signal with a high signal when the compensation voltage of compensation capacitor 214 is greater than the reference signal and output the second PWM signal with a low signal when the compensation voltage of compensation capacitor 214 is not greater than the reference signal.

Compensation module 220 may be configured to calculate a target voltage using one or more of a first measured input voltage, a second measured input voltage, an output voltage (e.g., measured using a voltage at resistor 230), and a compensation voltage at compensation capacitor 214. For example, compensation module 220 may be configured to drive the compensation voltage at compensation capacitor 214 to correspond to the target voltage. In the example of FIG. 2, compensation module 220 may be configured to generate a delayed first PWM signal ("PWM1'") which corresponds to the first PWM signal ("PWM1") with a delay.

Figure 3:
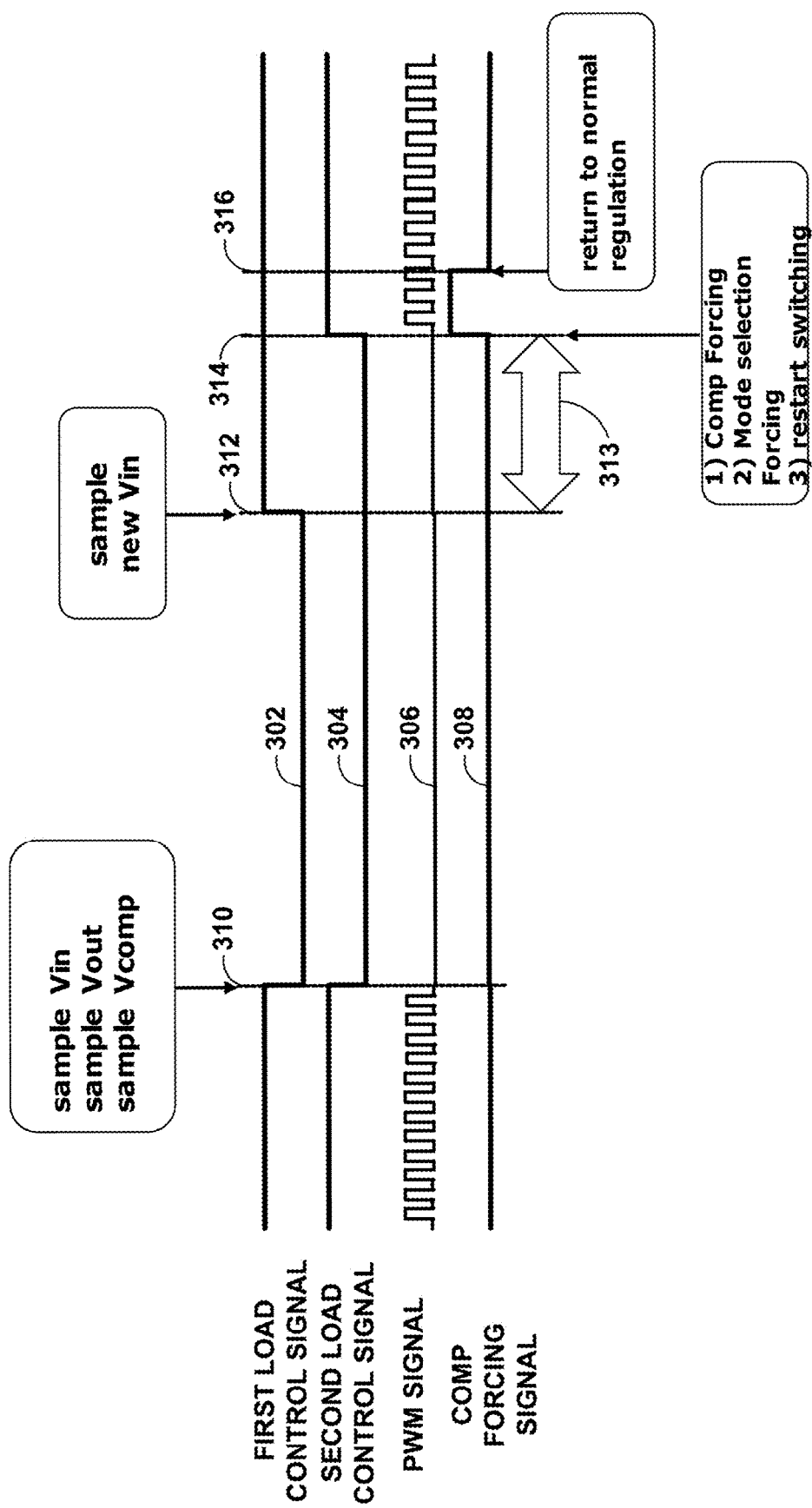
FIG. 3 is a diagram illustrating a first example performance of the system of FIG. 1, in accordance with one or more techniques of this disclosure.

FIG. 3 is a diagram illustrating a first example performance of system 100 of FIG. 1, in accordance with one or more techniques of this disclosure. For purposes of illustration only, FIG. 3 is described below within system 100 of FIG. 1 and circuit 200 of FIG. 2. The abscissa axis (e.g., horizontal) of FIG. 3 represents time and the ordinate axis (e.g., vertical) of FIG. 3 represents first load control signal 302, second load control signal 304, PWM signal 306, and compensation forcing signal 308.

At time, 310, controller circuit 112 determines load control signal 302 is transitioning from an on state to an off state. In response to load control signal 302 transitioning from the on state to the off state, controller circuit 112 generates a measured input voltage, a measured output voltage, and a compensation voltage. In some examples, values for one or more of the measured input voltage, the measured output voltage, and the compensation voltage are sensed and generated (e.g., stored or sampled) at substantially at the same time as controller circuit 112 determines load control signal 302 is transitioning from an on state to an off state. In some examples, however, controller circuit 112 may sense values for one or more of the measured input voltage, the measured output voltage, and the compensation voltage before controller circuit 112 determines load control signal 302 is transitioning from an on state to an off state and controller circuit 112 may generate (e.g., store or sample) a respective sample in response to load control signal 302 transitioning from an on state to an off state.

For example, controller circuit 112 may store one or more of an input voltage, output voltage, or a compensation voltage at one or more sampling capacitors. For example, controller circuit 112 may be configured to store, at a first sampling capacitor, a first measured input voltage at SMPS 108, store, at a second sampling capacitor, a measured output voltage at SMPS 108, and store, at a third sampling capacitor, a measured compensation voltage at compensation element 114. In some examples, controller circuit 112 may continuously sense a value of for one or more of the measured input voltage, the measured output voltage, and the compensation voltage and may store a respective value at a sampling capacitor only in response to determining load control signal 302 is transitioning from an on state to an off state.

Controller circuit 112 may sample one or more of an input voltage, output voltage, or a compensation voltage at one or more sampling capacitors using an ADC. For example, at time 310, controller circuit 112 may be configured to sample, using an ADC, a first measured input voltage at SMPS 108 for storage at a first memory, sample, using the ADC, a measured output voltage at SMPS 108 at a second memory, and sample, using the ADC, a measured compensation voltage at compensation element 114 at a third memory.

At time, 312, controller circuit 112 determines load control signal 302 is transitioning from the off state to the on state. In response to load control signal 302 transitioning from the off state to the on state, controller circuit 112 generates the second measured input voltage at a second sampling capacitor. For example, controller circuit 112 may be configured to store, at a fourth sampling capacitor, a second measured input voltage at SMPS 108. In some examples, at time 312, controller circuit 112 may be configured to sample, using the ADC, a second measured input voltage at SMPS 108.

During elaboration time 313, controller circuit 112 calculate a target voltage using one or more of the first measured input voltage at time 310, the second measured input voltage at time 312, the measured output voltage at time 310, and the compensation voltage at compensation element 114 at time 310. At time 314, the compensation forcing signal 308 is enabled (e.g., logical 1) which causes controller circuit 112 to drive the compensation voltage at compensation element 114 to the target voltage. At time 316, controller circuit 112 returns to normal regulation of the compensation voltage at compensation element 114 and refrains from driving the compensation voltage to the target voltage.

Figure 4:
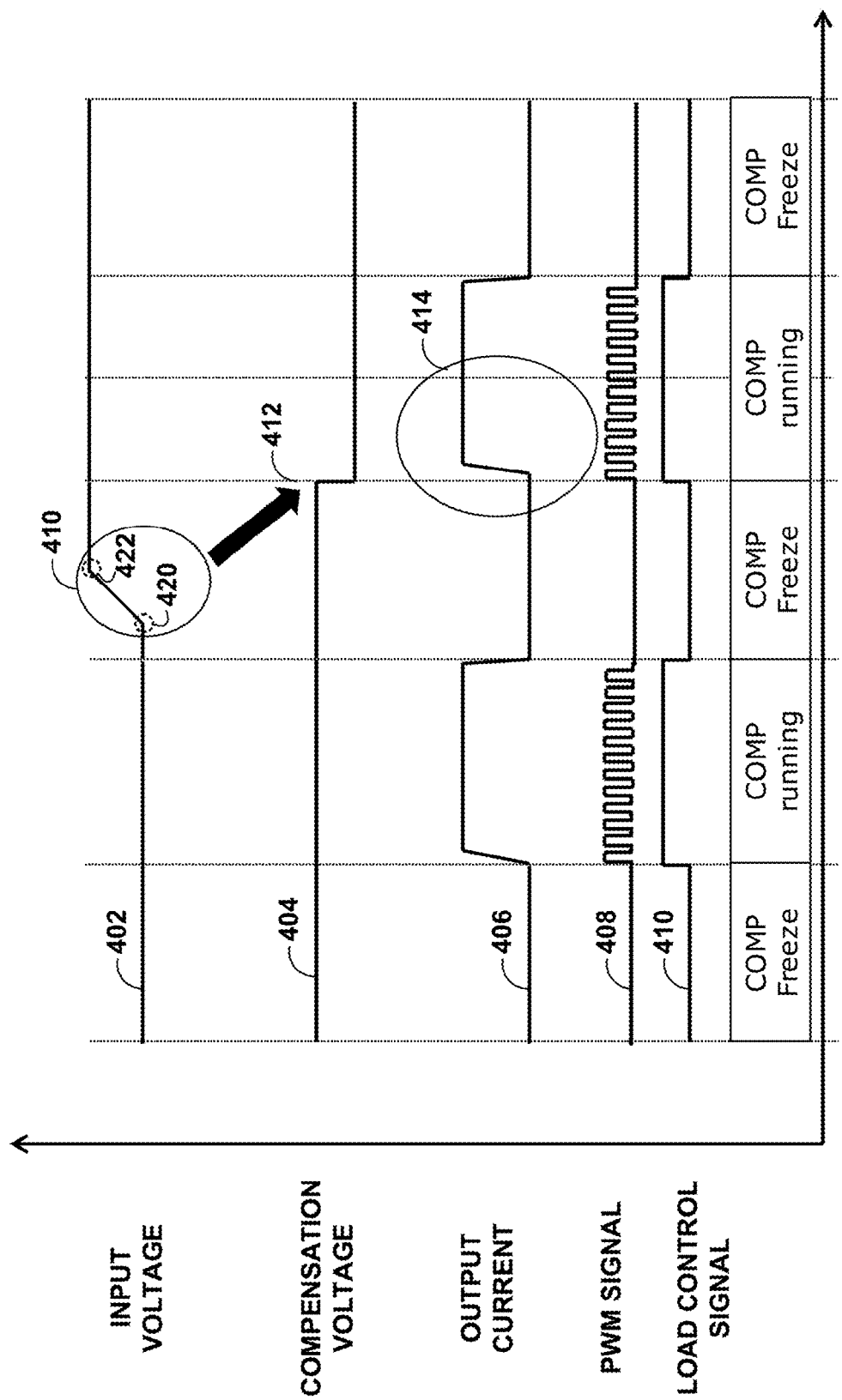
FIG. 4 is a diagram illustrating a second example performance of the system of FIG. 1, in accordance with one or more techniques of this disclosure.

FIG. 4 is a diagram illustrating a second example performance of the system of FIG. 1, in accordance with one or more techniques of this disclosure. For purposes of illustration only, FIG. 4 is described below within the context of FIGS. 1-3. The abscissa axis (e.g., horizontal) of FIG. 4 represents time and the ordinate axis (e.g., vertical) of FIG. 4 represents input voltage 402 at SMPS 108, compensation voltage 404 at compensation element 114, output current 406 to load 104, PWM signal 408 for switching SMPS 108, and load control signal 410 for switching load switching module 106.

At time range 410, input voltage 402 increases from first measured input voltage 420 to second measured input voltage 422. In this example, at time 412, controller circuit 112 drives compensation voltage 404 to a target voltage that is based on first measured input voltage 420 and second measured input voltage 422, which may result in less overshoot and/or overshoot in output current 406 compared to systems that keep compensation voltage 404 constant when input voltage 402 changes.

Figure 5:
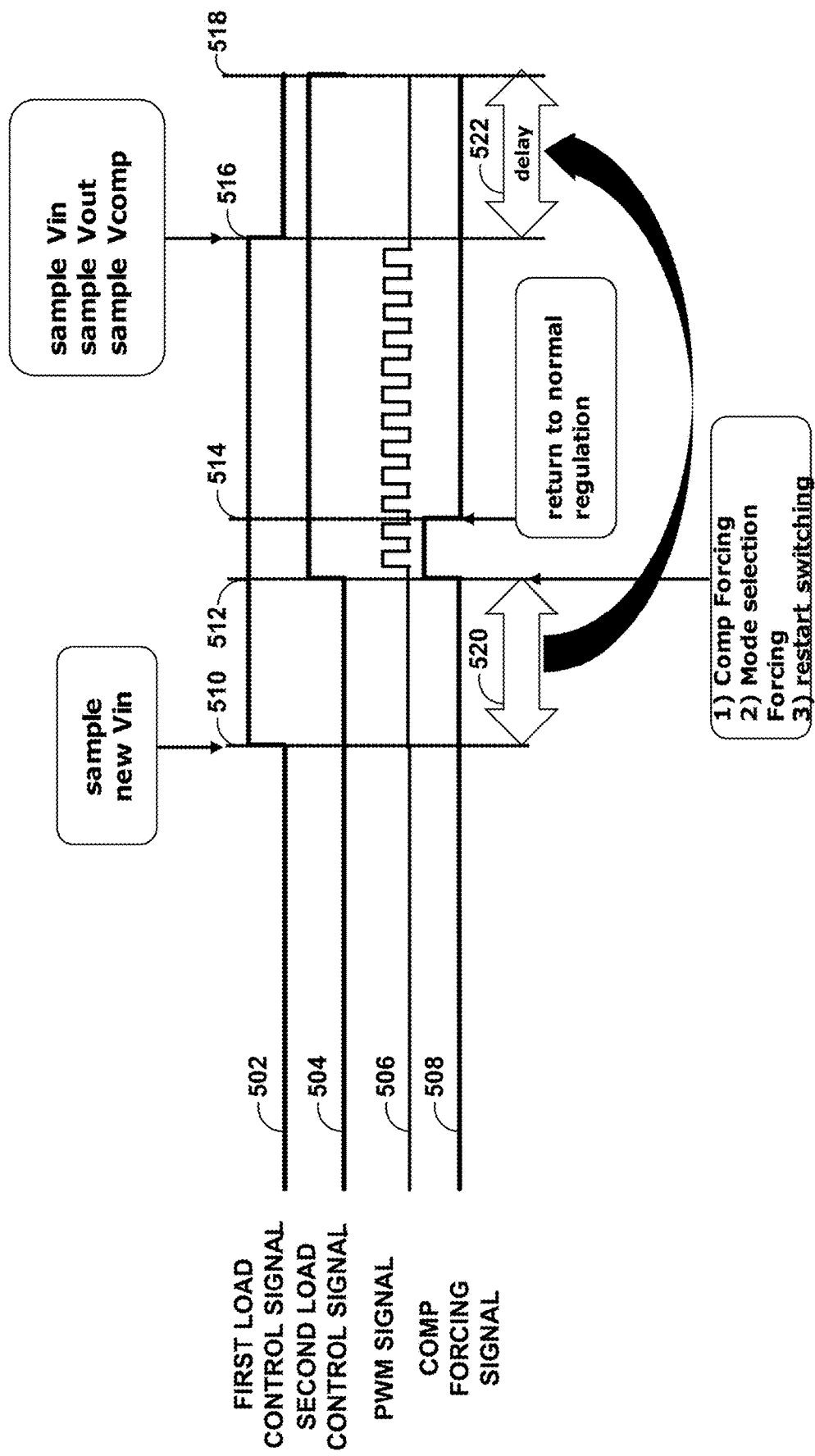
FIG. 5 is a diagram illustrating a third example performance of the system of FIG. 1, in accordance with one or more techniques of this disclosure.

FIG. 5 is a diagram illustrating a third example performance of the system of FIG. 1, in accordance with one or more techniques of this disclosure. For purposes of illustration only, FIG. 5 is described below within the context of FIGS. 1-4. The abscissa axis (e.g., horizontal) of FIG. 5 represents time and the ordinate axis (e.g., vertical) of FIG. 5 represents input first load control signal 502 received by controller circuit 112, second load control signal 504 output by controller circuit 112 for switching load switching module 106, PWM signal 506 for switching SMPS 108, and compensation forcing signal 508 (also referred to herein as simply "comp forcing signal").

In the example of FIG. 5, controller circuit 112 has previously generated a first measured input voltage corresponding to an input voltage at SMPS 108 in response to first load control signal 502 transitioning from an on state (e.g., logical 1) to an off state (e.g., logical 0). At time 510, controller circuit 112 generates a second measured input voltage corresponding to an input voltage at SMPS 108 in response to first load control signal 502 transitioning from the off state (e.g., logical 0) to the on state (e.g., logical 1).

During elaboration time 520, controller circuit 112 calculates a target voltage using at least the first measured input voltage and the second measured input voltage and selects a mode (e.g., buck mode, boost mode, buck-boost mode, etc.). Because of elaboration time 520, controller circuit 112 transitions compensation forcing signal 508 from an off state to an on state at time 512 instead of at time 510.

At time 512, compensation forcing signal 508 is enabled (e.g., logical 1) which causes controller circuit 112 to drive the compensation voltage at compensation element 114 to the target voltage. At time 514, controller circuit 112 returns to normal regulation of the compensation voltage at compensation element 114 and refrains from driving the compensation voltage to the target voltage. At time 516, controller circuit 112 determines first load control signal 502 is transitioning from an on state to an off state. In response to load control signal 502 transitioning from the on state to the off state, controller circuit 112 generates a measured input voltage, a measured output voltage, and a compensation voltage similar to the example of FIG. 3.

In the example of FIG. 5, however, second load control signal 504 corresponds to (e.g., matches) first load control signal 502 with delay 522. As shown, delay 522 may be equal to elaboration time 520 such that controller circuit 112 transitions compensation forcing signal 508 from an off state to an on state at time 518 instead of time 516. In this way, controller circuit 112 may drive load switching module 106 to have a switching frequency and duty cycle corresponding to first load control signal 502 while allowing for elaboration time 520. For example, controller circuit 112 may drive, using second load control signal 504, a switching element to establish a channel between load 104 to SMPS 108 when second load control signal 504 corresponds to the on state and to refrain from establishing the channel between load 104 to SMPS 108 when second load control signal 504 corresponds to the off state.

Figure 6:
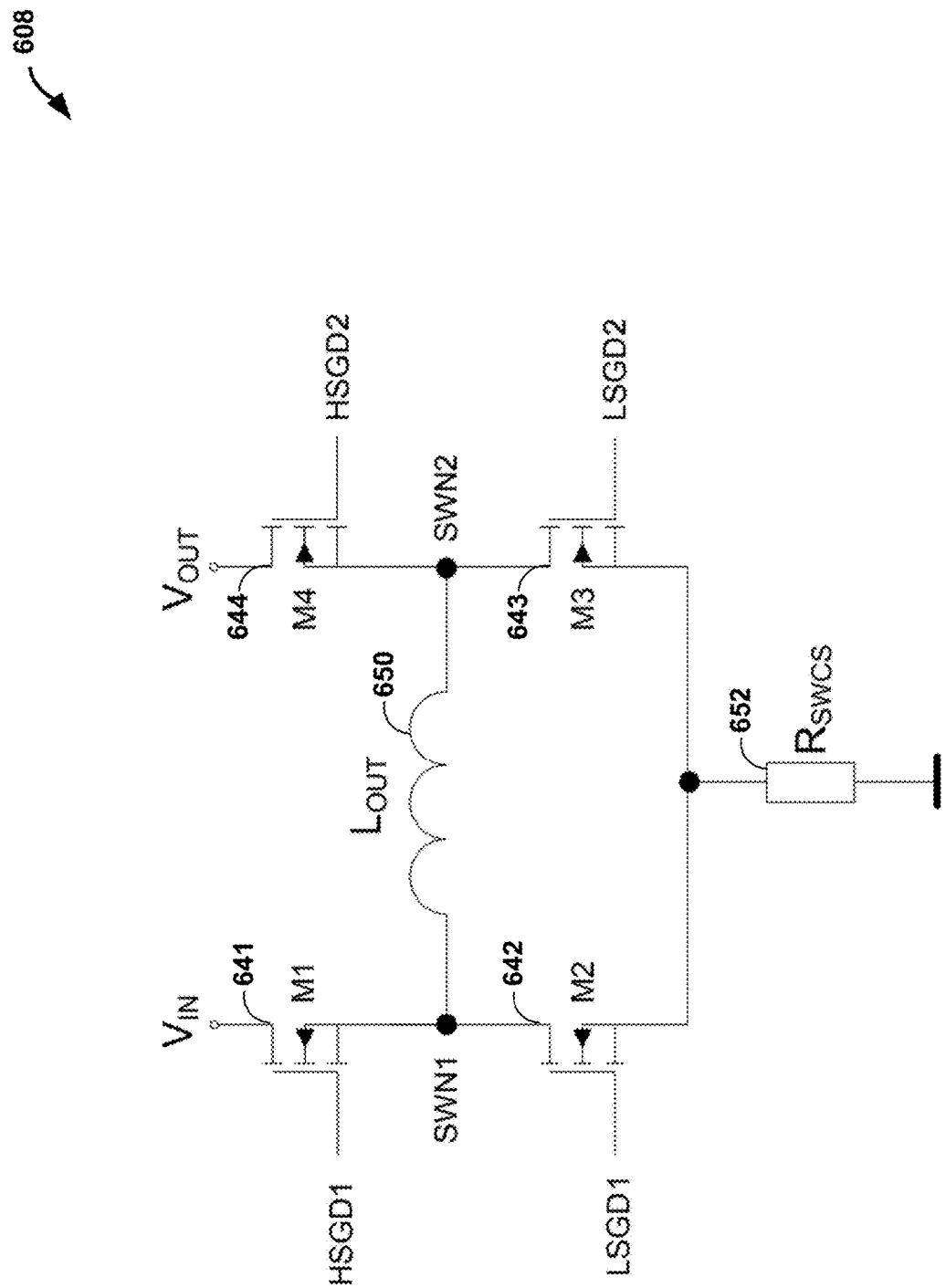
FIG. 6 is a circuit diagram illustrating an example switching-mode power supply (SMPS) of the system of FIG. 1, in accordance with one or more techniques of this disclosure.

FIG. 6 is a circuit diagram illustrating an example SMPS 608 of the system of FIG. 1, in accordance with one or more techniques of this disclosure. SMPS 608 may be an example of SMPS 108 of FIG. 1. For purposes of illustration only, FIG. 6 is described below within the context of FIGS. 1-5. As shown, SMPS 608 may include switching element 641, switching element 642, switching element 643, and switching element 644, inductor 650, and resistor 652.

SMPS 608 may be configured to operate using a plurality of modes. Examples of modes, may include, but are not limited to, buck mode, boost mode, and buck-boost mode. For example, SMPS 608 may be configured to couple a first switch node ("SWN1") of inductor 650 to a reference node (e.g., ground) via resistor 652, or to an input voltage ("$V_{IN}$") of SMPS 608. In this example, SMPS 608 may be configured to couple a second switch node ("SWN2") of inductor 650 to the reference node via resistor 652, or to an output voltage ("$V_{OUT}$") of SMPS 608.

Controller circuit 112 may be configured to select the mode for operating SMPS 608. For example, controller circuit 112 may be configured to select the mode from the plurality of modes using an input voltage at SMPS 608 and an output voltage at SMPS 608. For example, controller circuit 112 may be configured to select a buck mode in response to the input voltage being greater than the output voltage by a first threshold. In some examples, controller circuit 112 may be configured to select a boost mode in response to the input voltage is less than the output voltage by a second threshold. The second threshold may be the same or different than the first threshold. In some examples, controller circuit 112 may be configured to select a buck-boost mode in response to the input voltage being not greater than the output voltage by the first threshold and in response to the second measured input voltage being not less than the output voltage by the second threshold.

Controller circuit 112 may be configured to switch switching elements 641-644 based on the mode. For example, controller circuit 112 may be configured to switch in switching element 644 and switch out switching element 643 while selectively switching (e.g., switching in and switching out) switching elements 641 and 642 to operate in buck mode. In another example, controller circuit 112 may be configured to switch in switching element 641 and switch out switching element 642 while selectively switching (e.g., switching in and switching out) switching elements 643 and 644 to operate in boost mode.

Figure 7:
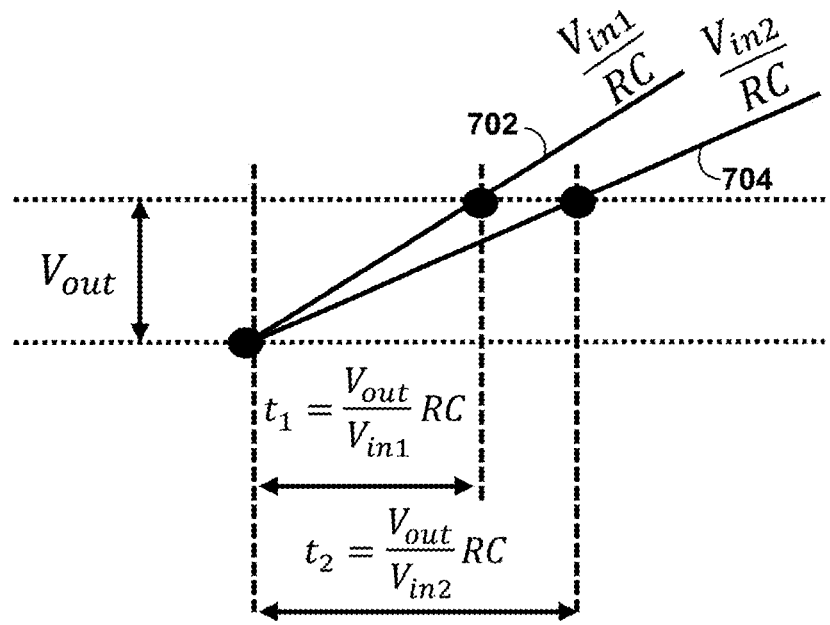
FIG. 7 is a conceptual diagram illustrating an example operation of the system of FIG. 1 when operating in a buck mode, in accordance with one or more techniques of this disclosure.

FIG. 7 is a conceptual diagram illustrating an example operation of system 100 of FIG. 1 when operating in a buck mode, in accordance with one or more techniques of this disclosure. For purposes of illustration only, FIG. 7 is described below context of FIGS. 1-6. The abscissa axis (e.g., horizontal) of FIG. 7 represents time and the ordinate axis (e.g., vertical) of FIG. 7 represents a first input voltage 702 at SMPS 108 and a second input voltage 704.

Controller circuit 112 may determine (e.g., using passive components and comparators) a compensation correction to be applied when a PWM signal returns high. For example, for buck mode, the change in compensation voltage ($\Delta V_{comp}$) may be calculated as follows.

$$\text{Buck} \rightarrow \Delta V_{comp} = K * V_{slope} * (DC_2 - DC_1) = \quad \text{EQUATION 1}$$
$$K * V_{slope} * V_{out} * \left(\frac{1}{V_{in2}} - \frac{1}{V_{in1}}\right)$$

where K is a gain, which may correspond to a reference current ($i_{ref}$), $V_{slope}$ is a voltage slope, which may correspond to a resistance (R), $DC_1$ is the output voltage divided by a first input voltage ($V_{in1}$), and $DC_2$ is the output voltage divided by a second measured input voltage ($V_{in2}$).

As such, the change in compensation may be calculated as follows.

$$\Delta V_{comp} = i_{ref} * R * V_{out} * \left(\frac{1}{V_{in2}} - \frac{1}{V_{in1}}\right) \quad \text{EQUATION 2}$$

Converting the change in compensation voltage of EQUATION 2 into a change in charge ($\Delta Q$) results in the following.

$$\Delta Q = \Delta V_{comp} * C = i_{ref} * R * C * V_{out} * \left(\frac{1}{V_{in2}} - \frac{1}{V_{in1}}\right) \quad \text{EQUATION 3}$$

where C is a capacitance of compensation element 114.

Figure 8:
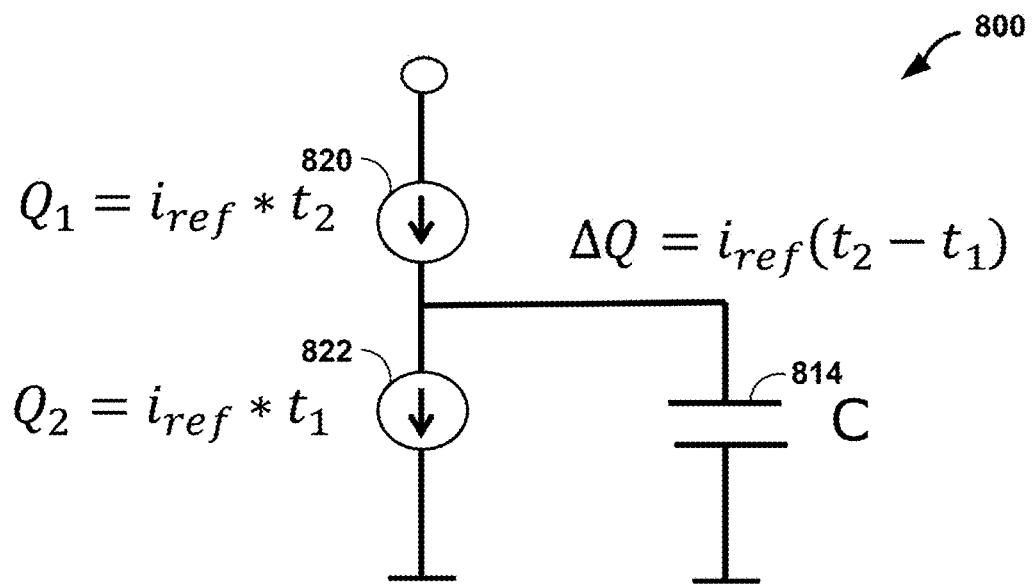
FIG. 8 is a circuit diagram illustrating a circuit for driving compensation voltage when operating in a buck mode, in accordance with one or more techniques of this disclosure.
Figure 9:
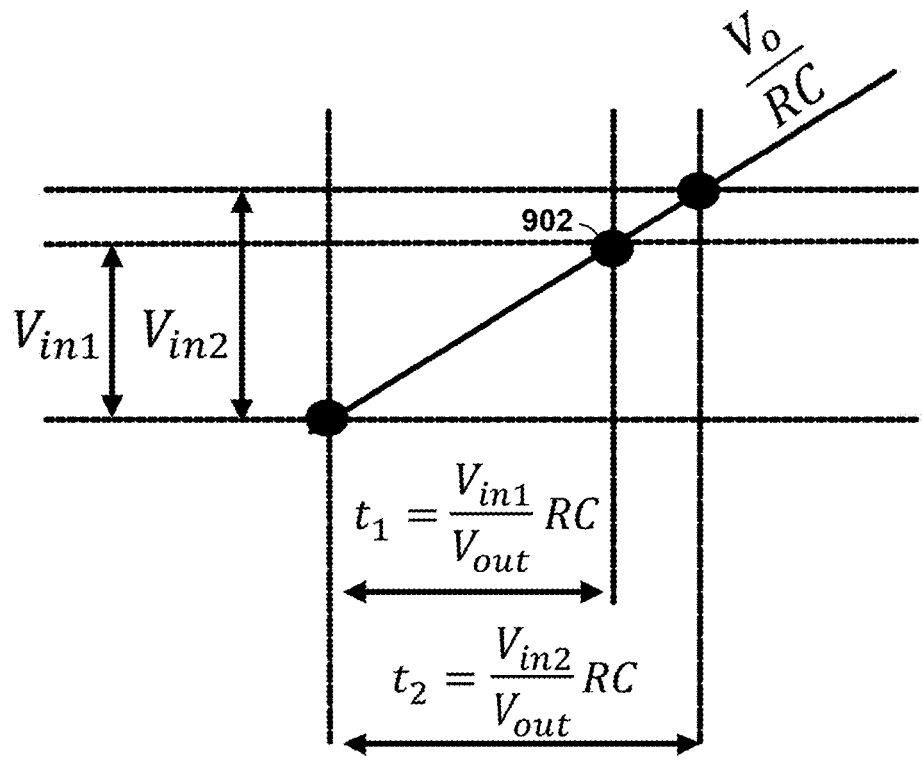
FIG. 9 is a conceptual diagram illustrating an example operation of the system of FIG. 1 when operating in a first boost mode, in accordance with one or more techniques of this disclosure.

FIG. 8 is a circuit diagram illustrating a circuit 800 for driving compensation voltage when operating in a buck mode, in accordance with one or more techniques of this disclosure. For purposes of illustration only, FIG. 9 is described below context of FIGS. 1-7. Circuit 800 includes current source 820, current source 822, and compensation capacitor 814, which may be an example of compensation element 114 of FIG. 1. As shown, current source 820 is directly coupled to compensation capacitor 814 to source current into compensation capacitor 814 and current source 822 is directly coupled to compensation capacitor 814 to sink current into compensation capacitor 814.

A first time ($t_1$) for operating current source 822 and a second time ($t_2$) for operating current source 820 may be calculated as follows.

$$t_1 = \frac{V_{out}}{V_{in1}} RC \qquad \text{EQUATION 4}$$

$$t_2 = \frac{V_{in2}}{V_{out}} RC \qquad \text{EQUATION 5}$$

That is, current source 820 may be configured to provide a first charge ($Q_1$) as follows.

$$Q_1 = i_{ref} * t_2 \qquad \text{EQUATION 6}$$

Current source 822 may be configured to sink a second charge ($Q_2$) as follows.

$$Q_2 = i_{ref} * t_1 \qquad \text{EQUATION 7}$$

Substituting EQUATIONS 4 and 5 into EQUATION 3 results in the following.

$$\Delta Q = i_{ref}(t_2 - t_1) \qquad \text{EQUATION 8}$$

In this way, controller circuit 112 may be configured to drive compensation voltage at compensation capacitor 814. More specifically, controller circuit 112 may be configured to drive current source 822 using a ratio of a voltage at a sampling capacitor corresponding to an output voltage at SMPS 108 and an input voltage a sampling capacitor corresponding to a first measured input voltage when the load control signal transitions from an on state to an off state. Similarly, controller circuit 112 may be configured to drive current source 820 using a ratio of voltage at the sampling capacitor corresponding to the output voltage at SMPS 108 and an input voltage at a sampling capacitor corresponding to a second measured input voltage when the load control signal transitions from the off state to the on state. In this example, controller circuit 112 is configured to drive current source 822 to discharge compensation capacitor 814 and drive current source 820 to charge compensation capacitor 814.

FIG. 9 is a conceptual diagram illustrating an example operation of system 100 of FIG. 1 when operating in a first boost mode, in accordance with one or more techniques of this disclosure. For purposes of illustration only, FIG. 9 is described below context of FIGS. 1-8. The abscissa axis (e.g., horizontal) of FIG. 9 represents time and the ordinate axis (e.g., vertical) of FIG. 9 represents output voltage 902 at SMPS 108.

Controller circuit 112 may determine (e.g., using passive components and comparators) a compensation correction to be applied when a PWM signal returns high. For example, for a first boost mode, the change in compensation voltage ($\Delta V_{comp}$) may be calculated as follows.

$$\text{Boost} \rightarrow \Delta V_{comp} = K * V_{slope} * (DC_2 - DC_1) +$$
$$K * I_{load} R_{ext} \left( \frac{1}{1-DC_1} - \frac{1}{1-DC_2} \right) = \qquad \text{EQUATION 9}$$

-continued
$$K * V_{slope} * \frac{1}{V_o} * (V_{in1} - V_{in2}) -$$
$$K * I_{load} * R_{ext} * V_o \left( \frac{1}{V_{in1}} - \frac{1}{V_{in2}} \right)$$

As such, the change in compensation may be calculated as follows.

$$\Delta V_{comp} = i_{ref} * R * \frac{1}{V_o} * (V_{in1} - V_{in2}) \qquad \text{EQUATION 10}$$

Converting the change in compensation voltage of EQUATION 10 into a change in charge ($\Delta Q$) results in the following.

$$\Delta Q = \Delta V_{comp} * C = i_{ref} * R * C * \frac{1}{V_o} * (V_{in1} - V_{in2}) \qquad \text{EQUATION 11}$$

Figure 10:
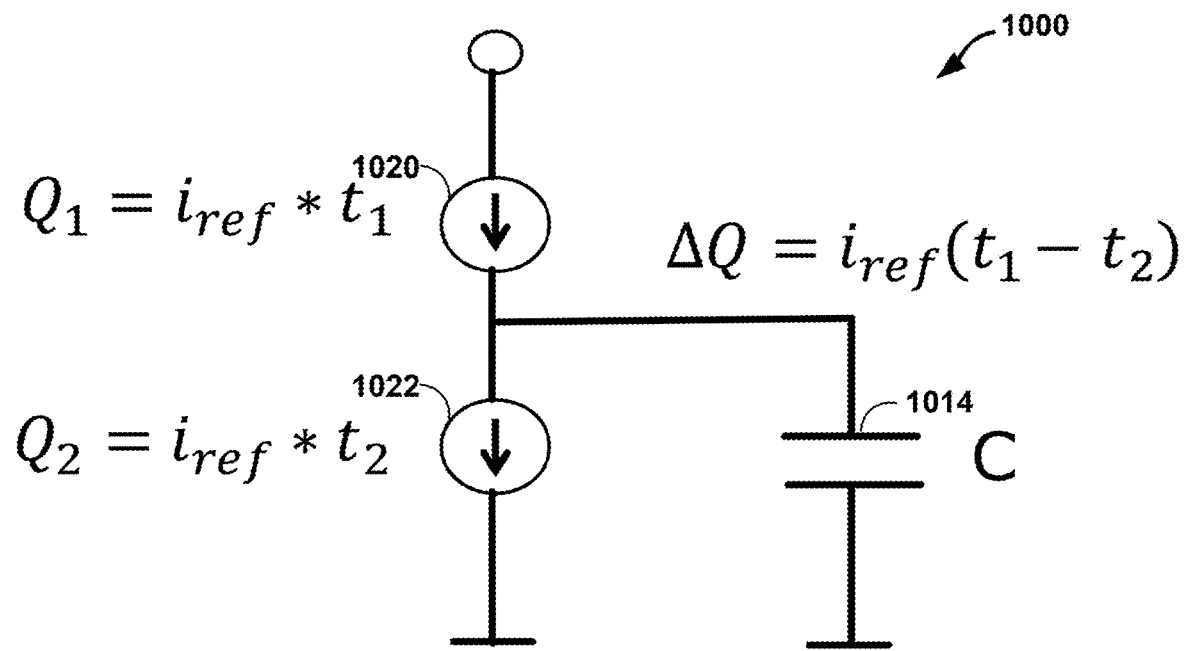
FIG. 10 is a circuit diagram illustrating a circuit for driving compensation voltage when operating in a first boost mode, in accordance with one or more techniques of this disclosure.

FIG. 10 is a circuit diagram illustrating a circuit 1000 for driving compensation voltage when operating in a first boost mode, in accordance with one or more techniques of this disclosure. For purposes of illustration only, FIG. 9 is described below context of FIGS. 1-9. Circuit 1000 includes current source 1020, current source 1022, and compensation capacitor 1014, which may be an example of compensation element 114 of FIG. 1. As shown, current source 1020 is directly coupled to compensation capacitor 1014 to source current into compensation capacitor 1014 and current source 1022 is directly coupled to compensation capacitor 1014 to sink current into compensation capacitor 1014.

A first time ($t_1$) for operating current source 1020 and a second time ($t_2$) for operating current source 1022 may be calculated as follows.

$$t_1 = \frac{V_{in1}}{V_{out}} RC \qquad \text{EQUATION 12}$$

$$t_2 = \frac{V_{in2}}{V_{out}} RC \qquad \text{EQUATION 13}$$

That is, current source 1020 may be configured to provide a first charge ($Q_1$) as follows.

$$Q_1 = i_{ref} * t_1 \qquad \text{EQUATION 14}$$

Current source 1022 may be configured to sink a second charge ($Q_2$) as follows.

$$Q_2 = i_{ref} * t_2 \qquad \text{EQUATION 15}$$

Substituting EQUATIONS 12 and 13 into EQUATION 11 results in the following.

$$\Delta Q = i_{ref}(t_1 - t_2) \qquad \text{EQUATION 16}$$

In this way, controller circuit 112 may be configured to drive compensation voltage at compensation capacitor 1014. More specifically, controller circuit 112 may be configured to drive current source 1020 using a ratio of a voltage at a sampling capacitor corresponding to an output voltage at SMPS 108 and an input voltage a sampling capacitor corresponding to a first measured input voltage when the load control signal transitions from an on state to an off state. Similarly, controller circuit 112 may be configured to drive current source 1022 using a ratio of voltage at the sampling capacitor corresponding to the output voltage at SMPS 108 and an input voltage at a sampling capacitor corresponding to a second measured input voltage when the load control signal transitions from the off state to the on state. In this example, controller circuit 112 is configured to drive current source 1022 to discharge compensation capacitor 1014 and drive current source 1020 to charge compensation capacitor 1014.

Figure 11:
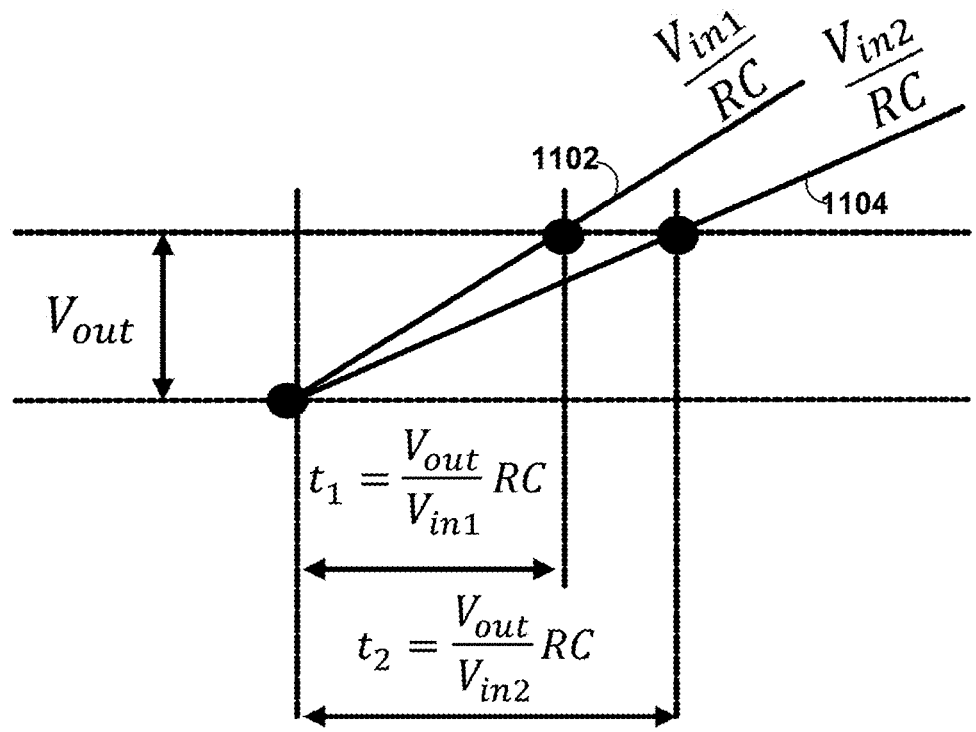
FIG. 11 is a conceptual diagram illustrating an example operation of the system of FIG. 1 when operating in a second boost mode, in accordance with one or more techniques of this disclosure.

FIG. 11 is a conceptual diagram illustrating an example operation of the system of FIG. 1 when operating in a second boost mode, in accordance with one or more techniques of this disclosure. For purposes of illustration only, FIG. 11 is described below context of FIGS. 1-10. The abscissa axis (e.g., horizontal) of FIG. 11 represents time and the ordinate axis (e.g., vertical) of FIG. 11 represents first output voltage 1102 at SMPS 108 for a first input voltage and a second output voltage 1104 for a second measured input voltage.

Controller circuit 112 may determine (e.g., using passive components and comparators) a compensation correction to be applied when a PWM signal returns high. For example, for a second boost mode, the change in compensation voltage ($\Delta V_{comp}$) may be calculated as follows.

$$\text{Boost} \rightarrow \Delta V_{comp} = K * V_{slope} * (DC_2 - DC_1) +$$
$$K * I_{load} R_{ext}\left(\frac{1}{1-DC_1} - \frac{1}{1-DC_2}\right) =$$
$$K * V_{slope} * \frac{1}{V_o} * (V_{in1} - V_{in2}) -$$
$$K * I_{load} * R_{ext} * V_o\left(\frac{1}{V_{in1}} - \frac{1}{V_{in2}}\right)$$

EQUATION 17

As such, the change in compensation may be calculated as follows.

$$\Delta V_{comp} = i_{ref} * R * V_o * \left(\frac{1}{V_{in1}} - \frac{1}{V_{in2}}\right)$$

EQUATION 18

Converting the change in compensation voltage of EQUATION 17 into a change in charge ($\Delta Q$) results in the following.

$$\Delta Q = \Delta V_{comp} * C = i_{ref} * R * C * V_{out} * \left(\frac{1}{V_{in2}} - \frac{1}{V_{in1}}\right)$$

EQUATION 19

Figure 12:
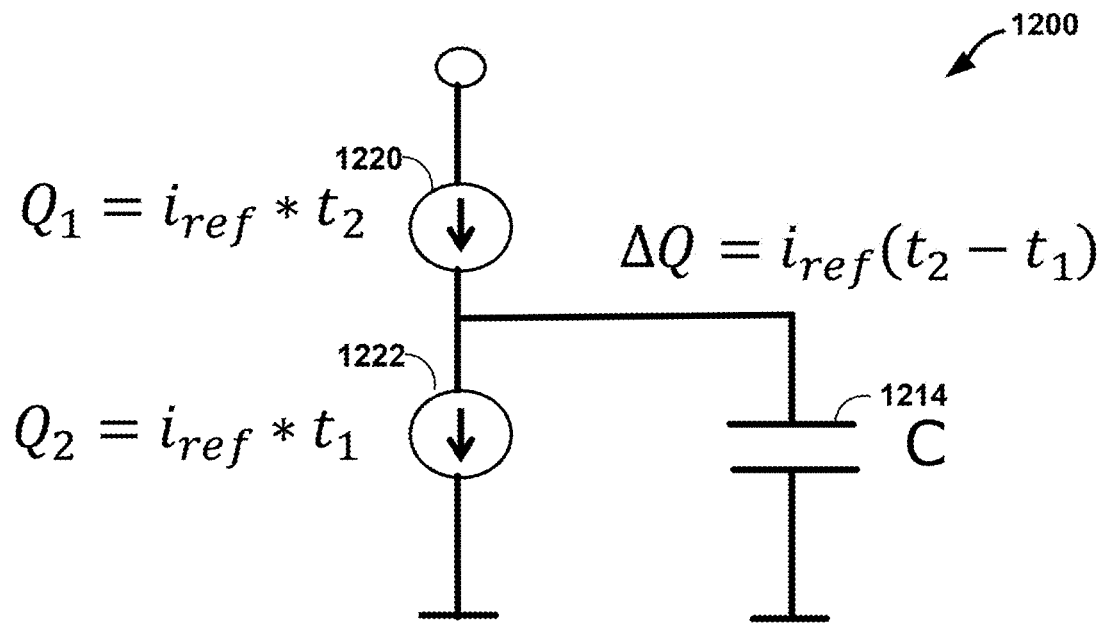
FIG. 12 is a circuit diagram illustrating a circuit for driving compensation voltage when operating in a second boost mode, in accordance with one or more techniques of this disclosure.

FIG. 12 is a circuit diagram illustrating a circuit 1200 for driving compensation voltage when operating in a second boost mode, in accordance with one or more techniques of this disclosure. For purposes of illustration only, FIG. 11 is described below context of FIGS. 1-11. Circuit 1200 includes current source 1220, current source 1222, and compensation capacitor 1214, which may be an example of compensation element 114 of FIG. 1. As shown, current source 1220 is directly coupled to compensation capacitor 1214 to source current into compensation capacitor 1214 and current source 1222 is directly coupled to compensation capacitor 1214 to sink current into compensation capacitor 1214.

A first time ($t_1$) for operating current source 1222 and a second time ($t_2$) for operating current source 1220 may be calculated as follows.

$$t_1 = \frac{V_{out}}{V_{in1}} RC$$

EQUATION 20

$$t_2 = \frac{V_{out}}{V_{in2}} RC$$

EQUATION 21

That is, current source 1220 may be configured to provide a first charge ($Q_1$) as follows.

$$Q_1 = i_{ref} * t_2$$

EQUATION 22

Current source 1222 may be configured to sink a second charge ($Q_2$) as follows.

$$Q_2 = i_{ref} * t_1$$

EQUATION 23

Substituting EQUATIONS 20 and 21 into EQUATION 19 results in the following.

$$\Delta Q = i_{ref}(t_2 - t_1)$$

EQUATION 24

In this way, controller circuit 112 may be configured to drive compensation voltage at compensation capacitor 1214. More specifically, controller circuit 112 may be configured to drive current source 1222 using a ratio of a voltage at a sampling capacitor corresponding to an output voltage at SMPS 108 and an input voltage a sampling capacitor corresponding to a first measured input voltage when the load control signal transitions from an on state to an off state. Similarly, controller circuit 112 may be configured to drive current source 1220 using a ratio of voltage at the sampling capacitor corresponding to the output voltage at SMPS 108 and an input voltage at a sampling capacitor corresponding to a second measured input voltage when the load control signal transitions from the off state to the on state. In this example, controller circuit 112 is configured to drive current source 1222 to discharge compensation capacitor 814 and drive current source 1220 to charge compensation capacitor 814.

Figure 13:
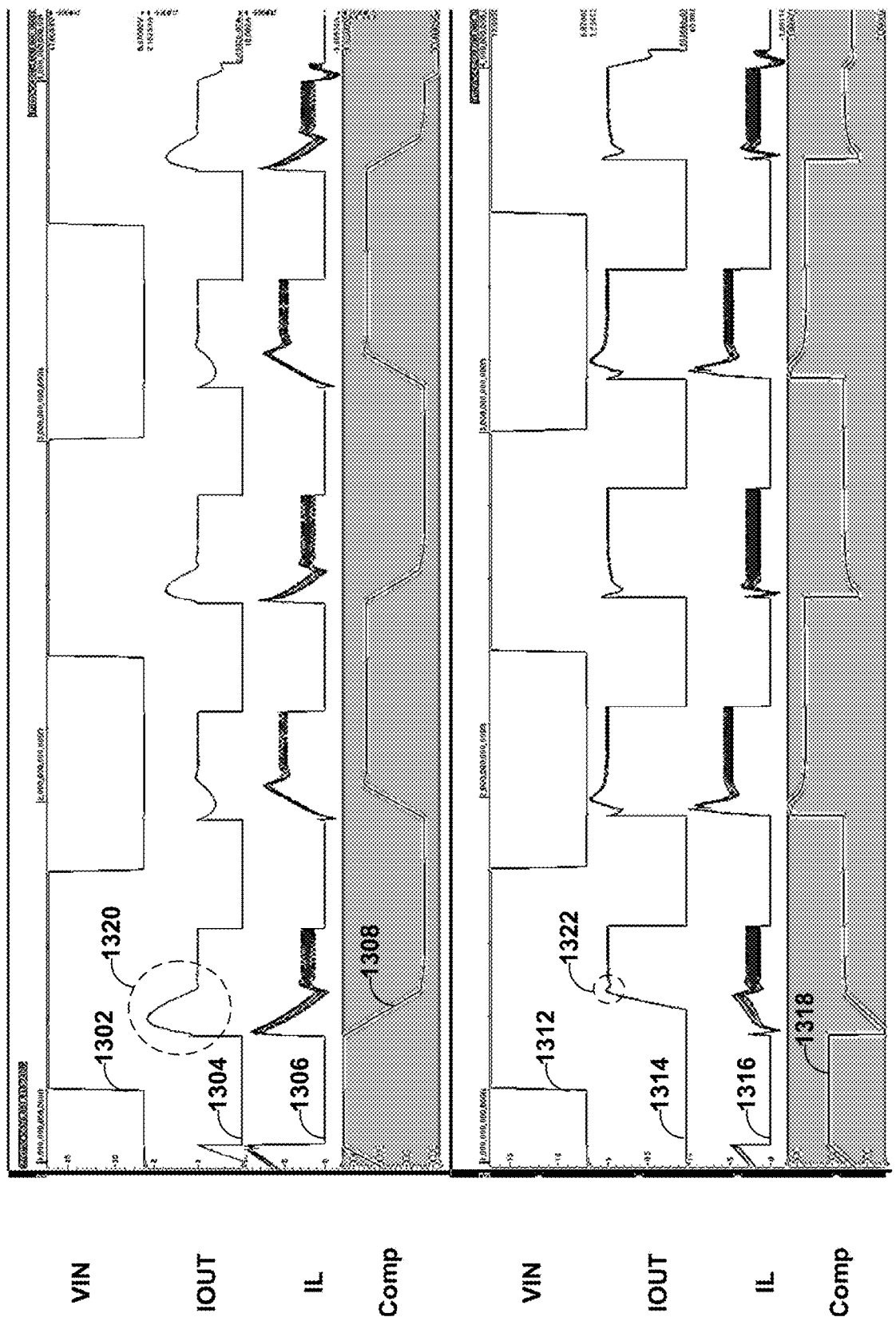
FIG. 13 is a diagram illustrating an example output current at a load of the system of FIG. 1, in accordance with one or more techniques of this disclosure.

FIG. 13 is a diagram illustrating an example output current 1304 at load 104 of system 100 of FIG. 1, in accordance with one or more techniques of this disclosure. For purposes of illustration only, FIG. 13 is described below within the context of FIGS. 1-12. The abscissa axis (e.g., horizontal) of FIG. 13 represents time and the ordinate axis (e.g., vertical) of FIG. 13 represents input voltage 1302 at an SMPS, output current 1304 to a load, inductor current 1306 at an SMPS, and compensation voltage 1308 at a compensation element for systems that keep compensation voltage 1308 constant when input voltage 1302 changes. The ordinate axis of FIG. 13 further represents input voltage 1312 at SMPS 108, output current 1314 to load 104, inductor current 1316 at SMPS 108, and compensation voltage 1318 at compensation element 114 for system 100. As shown, system 100 may have an overshoot 1322 that is less than overshoot 1320 for systems that keep compensation voltage 1308 constant when input voltage 1302 changes, which may improve a reliability of load 104 (e.g., a set of LEDs).

Figure 14:
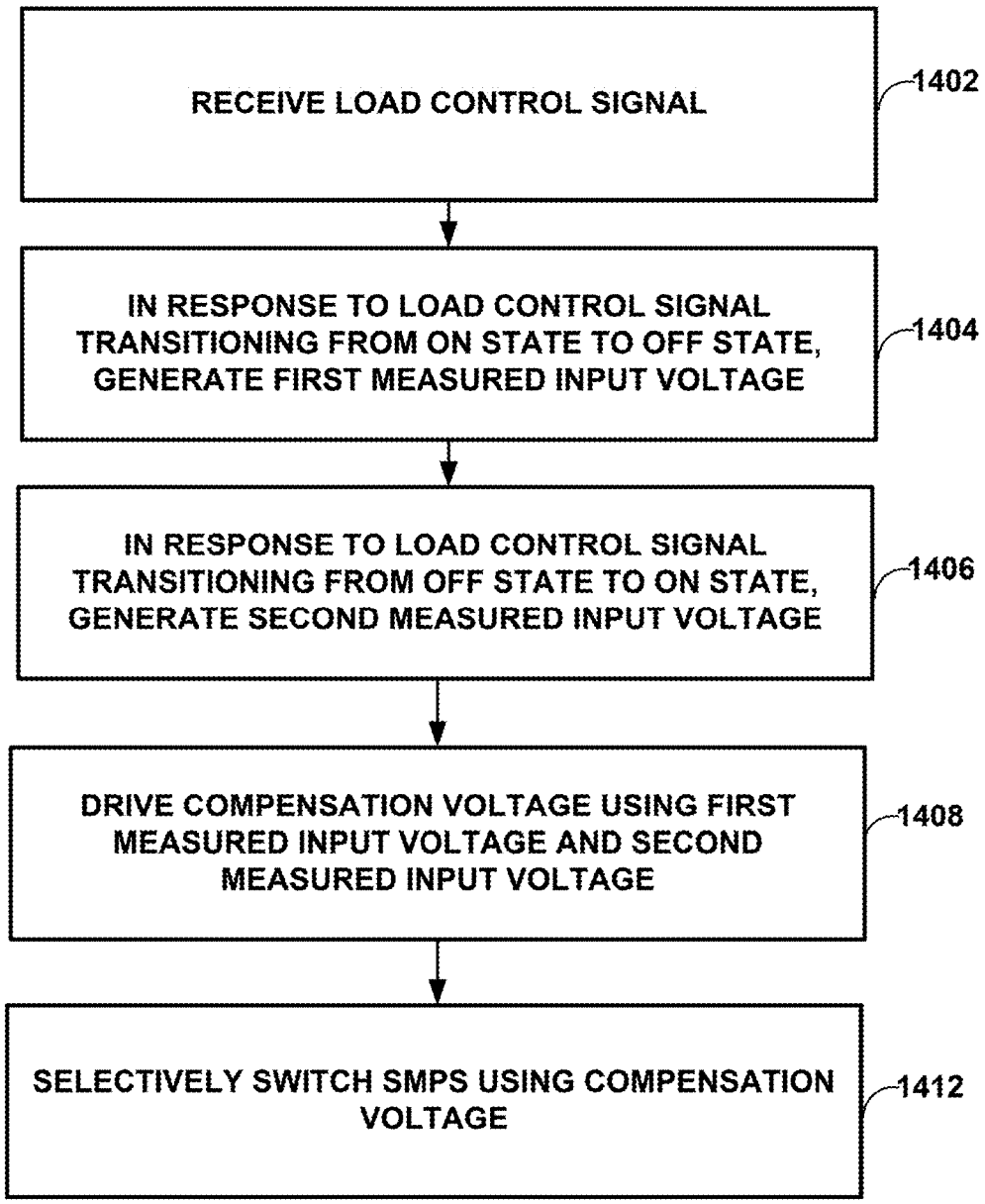
FIG. 14 is a first flow diagram consistent with techniques that may be performed by the example system of FIG. 1, in accordance with this disclosure.

FIG. 14 is a first flow diagram consistent with techniques that may be performed by the example system of FIG. 1, in accordance with this disclosure. In accordance with one or more techniques of this disclosure. For purposes of illustration only, FIG. 14 is described below within the context of FIGS. 1-13. Controller circuit 112 receives a load control signal indicating an on state when load 104 is to be coupled to SMPS 108 and an off state when load 104 is not to be coupled to SMPS 108 (1402). In response to the load control signal transitioning from the on state to the off state, controller circuit 112 generates a first measured input voltage corresponding to an input voltage at SMPS 108 (1404). For example, controller circuit 112 stores the first measured input voltage at a sampling capacitor. In some examples, controller circuit 112 samples the first measured input voltage using an ADC for storage in memory.

In response to the load control signal transitioning from the off state to the on state, controller circuit 112 generates a second measured input voltage corresponding to the input voltage at SMPS 108 (1406). For example, controller circuit 112 stores the second measured input voltage at a sampling capacitor. In some examples, controller circuit 112 samples the second measured input voltage using an ADC for storage in memory.

Controller circuit 112 drives a compensation voltage at compensation element 114 using the first measured input voltage and the second measured input voltage (1408). For example, controller circuit 112 drives the compensation element 114 using digital components and/or analog components. Controller circuit 112 selectively switches SMPS 108 using the compensation voltage at compensation element 114 (1412).

Figure 15:
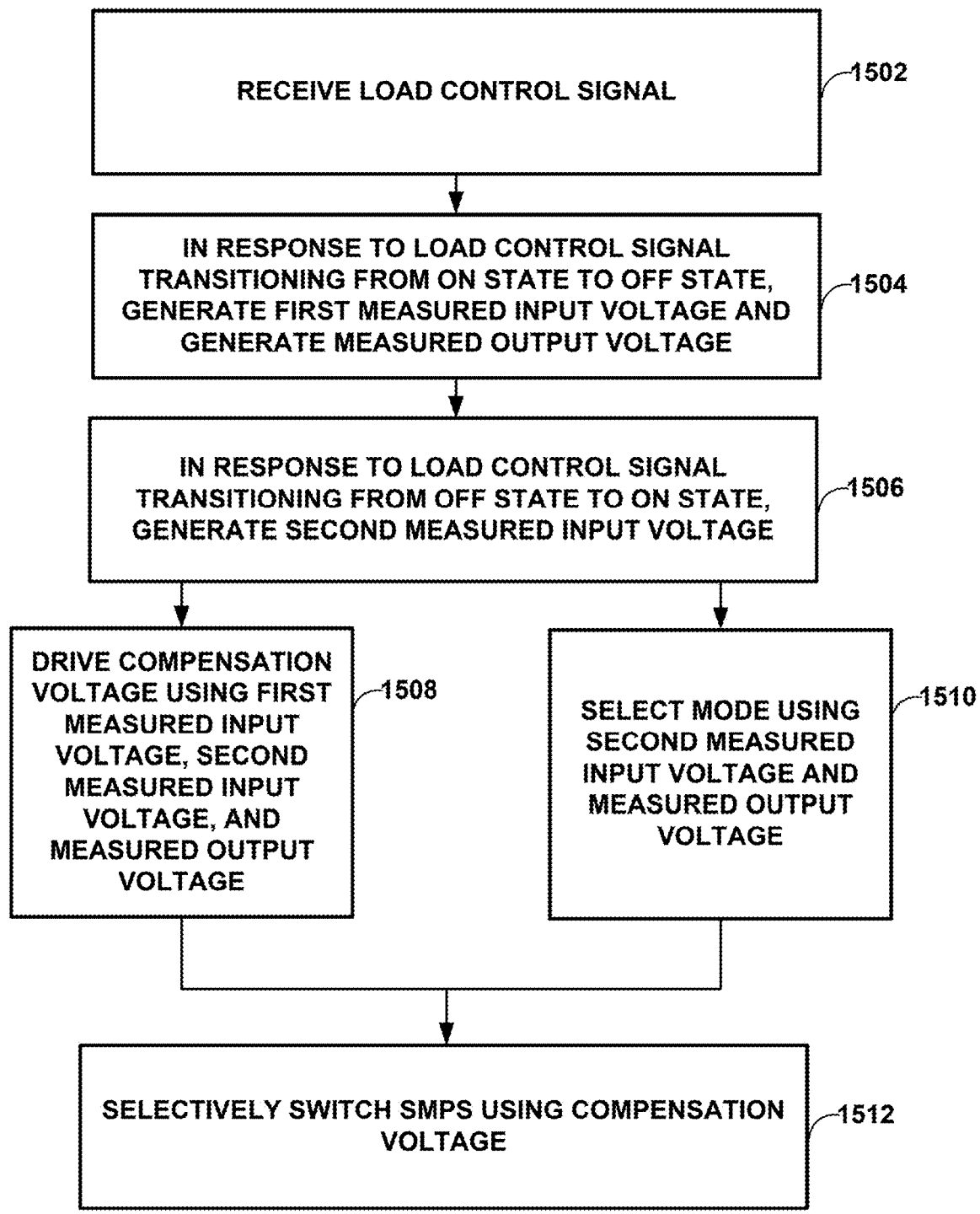
FIG. 15 is a second flow diagram consistent with techniques that may be performed by the example system of FIG. 1, in accordance with this disclosure.

FIG. 15 is a second flow diagram consistent with techniques that may be performed by the example system of FIG. 1, in accordance with this disclosure. In accordance with one or more techniques of this disclosure. For purposes of illustration only, FIG. 15 is described below within the context of FIGS. 1-14. Controller circuit 112 receives a load control signal indicating an on state when load 104 is to be coupled to SMPS 108 and an off state when load 104 is not to be coupled to SMPS 108 (1502). In response to the load control signal transitioning from the on state to the off state, controller circuit 112 generates a first measured input voltage corresponding to an input voltage at SMPS 108 and generates a measured output voltage corresponding to an output voltage at SMPS 108 (1504). For example, controller circuit 112 stores the first measured input voltage at a first sampling capacitor and stores the measured output voltage at a second sampling capacitor. In some examples, controller circuit 112 samples the first measured input voltage and the measured output voltage using an ADC for storage in memory.

In response to the load control signal transitioning from the off state to the on state, controller circuit 112 generates a second measured input voltage corresponding to the input voltage at SMPS 108 (1506). For example, controller circuit 112 stores the second measured input voltage at a sampling capacitor. In some examples, controller circuit 112 samples the second measured input voltage using an ADC for storage in memory.

Controller circuit 112 drives a compensation voltage at compensation element 114 using the first measured input voltage, the second measured input voltage, and the measured output voltage (1508). For example, controller circuit 112 drives the compensation element 114 using digital components and/or analog components. Controller circuit 112 selects a mode using the second measured input voltage and the measured output voltage (1510). Controller circuit 112 selectively switches SMPS 108 using the compensation voltage at compensation element 114 (1512).

The following examples may illustrate one or more aspects of the disclosure.

Example 1

A controller circuit for controlling a switching-mode power supply (SMPS), the controller circuit being configured to: receive a load control signal indicating an on state when a load is to be coupled to the SMPS and an off state when the load is not to be coupled to the SMPS; in response to the load control signal transitioning from the on state to the off state, generate a first measured input voltage corresponding to an input voltage at the SMPS; in response to the load control signal transitioning from the off state to the on state, generate a second measured input voltage corresponding to the input voltage at the SMPS; drive a compensation voltage at a compensation element using the first measured input voltage and the second measured input voltage; and selectively switch the SMPS using the compensation voltage after driving the compensation voltage.

Example 2

The controller circuit of example 1, further comprising: in response to the load control signal transitioning from the on state to the off state, generate a measured output voltage corresponding to an output voltage at the SMPS, wherein, to drive the compensation voltage, the controller circuit is configured to drive the compensation voltage using the first measured input voltage, the second measured input voltage, and the measured output voltage.

Example 3

The controller circuit of any combination of examples 1-2, wherein the load control signal is a first pulse-width modulated (PWM) signal at a first frequency; and wherein, to selectively switch the SMPS, the controller circuit is configured to generate a second PWM signal at a second frequency for switching the SMPS, the second frequency being greater than the first frequency.

Example 4

The controller circuit of any combination of examples 1-3, wherein, to generate the second PWM signal, the controller circuit is configured to generate the second PWM signal with a duty cycle that corresponds to the compensation voltage.

Example 5

The controller circuit of any combination of examples 1-4, wherein the compensation element comprises a capacitor.

Example 6

The controller circuit of any combination of examples 1-5, wherein the load comprises a set of light emitting diodes.

Example 7

The controller circuit of any combination of examples 1-6, wherein the controller circuit is configured to operate the SMPS using a plurality of modes.

Example 8

The controller circuit of any combination of examples 1-7, wherein the controller circuit is configured to: select a mode from the plurality of modes using the second measured input voltage and an output voltage at the SMPS.

Example 9

The controller circuit of any combination of examples 1-8, wherein, to determine the mode, the controller circuit is configured to: select a buck mode in response to the second measured input voltage being greater than the output voltage by a first threshold; select a boost mode in response to the second measured input voltage being less than the output voltage by a second threshold; and select a buck-boost mode in response to the second measured input voltage being not greater than the output voltage by the first threshold and in response to the second measured input voltage being not less than the output voltage by the second threshold.

Example 10

The controller circuit of any combination of examples 1-9, wherein the load control signal is a first load control signal and wherein the controller circuit is configured to: generate a second load control signal corresponding to the first load control signal with a delay; and drive, using the second load control signal, a switching element to establish a channel between the load to the SMPS when the second load control signal corresponds to an on state and to refrain from establishing the channel between the load to the SMPS when the second load control signal corresponds to an off state.

Example 11

The controller circuit of any combination of examples 1-10, wherein, to generate the first measured input voltage, the controller circuit is configured to store the first measured input voltage at a first sampling capacitor; wherein, to generate the second measured input voltage, the controller circuit is configured to store the second measured input voltage at a second sampling capacitor; and wherein the controller circuit is further configured to, in response to the load control signal transitioning from the on state to the off state, store a measured output voltage at a third sampling capacitor corresponding to an output voltage at the SMPS.

Example 12

The controller circuit of any combination of examples 1-11, wherein the controller circuit comprises a first current source directly coupled to the compensation element and a second current source directly coupled to the compensation element and wherein, to drive voltage at the compensation element, the controller circuit is configured to: drive the first current source using a ratio of voltage at the third sampling capacitor and voltage at the first sampling capacitor; and drive the second current source using a ratio of voltage at the third sampling capacitor and voltage at the second sampling capacitor.

Example 13

The controller circuit of any combination of examples 1-12, wherein, to drive the compensation voltage, the controller circuit is configured to: drive the first current source to charge the compensation element and drive the second current source to discharge the compensation element; or drive the first current source to discharge the compensation element and drive the second current source to charge the compensation element.

Example 14

The controller circuit of any combination of examples 1-13, wherein, to generate the first measured input voltage, the controller circuit is configured to sample the first measured input voltage using an analog-to-digital converter (ADC); wherein, to generate the second measured input voltage, the controller circuit is configured to sample the second measured input voltage using the ADC; wherein the controller circuit is further configured to sample, in response to the load control signal transitioning from the on state to the off state, an output voltage at the SMPS using the ADC; and wherein the controller circuit comprises digital circuitry configured to calculate a target voltage using the sample the first measured input voltage, the sample of the second measured input voltage, and the sample of the output voltage and wherein, to drive the compensation voltage, the controller circuit is configured to drive the compensation voltage to correspond to the target voltage.

Example 15

A method for controlling a switching-mode power supply (SMPS), the method comprising: receiving, by a controller circuit, a load control signal indicating an on state when a load is to be coupled to the SMPS and an off state when the load is not to be coupled to the SMPS; in response to the load control signal transitioning from the on state to the off state, generating, by the controller circuit, a first measured input voltage corresponding to an input voltage at the SMPS; in response to the load control signal transitioning from the off state to the on state, generating, by the controller circuit, a second measured input voltage corresponding to the input voltage at the SMPS; driving, by the controller circuit, a compensation voltage at a compensation element using the first measured input voltage and the second measured input voltage; and selectively switching, by the controller circuit, the SMPS using the compensation voltage after driving the compensation voltage.

Example 16

The method of example 15, further comprising: in response to the load control signal transitioning from the on state to the off state, generating, by the controller circuit, a measured output voltage corresponding to an output voltage at the SMPS, wherein driving the compensation voltage comprises driving the compensation voltage using the first measured input voltage, the second measured input voltage, and the measured output voltage.

Example 17

The method of any combination of examples 15-16, wherein the load control signal is a first pulse-width modulated (PWM) signal at a first frequency; and wherein selectively switching the SMPS comprises generating a second PWM signal at a second frequency for switching the SMPS, the second frequency being greater than the first frequency.

Example 18

The method of any combination of examples 15-17, wherein generating the second PWM signal comprises generating the second PWM signal with a duty cycle that corresponds to the compensation voltage.

Example 19

The method of any combination of examples 15-18, wherein the controller circuit is configured to operate the SMPS using a plurality of modes.

Example 20

A system comprising: a set of light emitting diodes (LEDs); a switching-mode power supply (SMPS); and a controller circuit configured to: receive a load control signal indicating an on state when the set of LEDs is to be coupled to the SMPS and an off state when the set of LEDs is not to be coupled to the SMPS; in response to the load control signal transitioning from the on state to the off state, generate a first measured input voltage corresponding to an input voltage at the SMPS; in response to the load control signal transitioning from the off state to the on state, generate a second measured input voltage corresponding to the input voltage at the SMPS; drive a compensation voltage at a compensation element using the first measured input voltage and the second measured input voltage; and selectively switch the SMPS using the compensation voltage after driving the compensation voltage.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

Various aspects have been described in this disclosure. These and other aspects are within the scope of the following claims.

The invention claimed is:

1. A controller circuit for controlling a switching-mode power supply (SMPS), the controller circuit being configured to:
   receive a load control signal indicating an on state when a load is to be coupled to the SMPS and an off state when the load is not to be coupled to the SMPS;
   in response to the load control signal transitioning from the on state to the off state, generate a first measured input voltage corresponding to an input voltage at the SMPS;
   in response to the load control signal transitioning from the off state to the on state, generate a second measured input voltage corresponding to the input voltage at the SMPS;
   drive a compensation voltage at a compensation element using the first measured input voltage and the second measured input voltage; and
   selectively switch the SMPS using the compensation voltage after driving the compensation voltage.

2. The controller circuit of claim 1, further comprising:
   in response to the load control signal transitioning from the on state to the off state, generate a measured output voltage corresponding to an output voltage at the SMPS,
   wherein, to drive the compensation voltage, the controller circuit is configured to drive the compensation voltage using the first measured input voltage, the second measured input voltage, and the measured output voltage.

3. The controller circuit of claim 1,
   wherein the load control signal is a first pulse-width modulated (PWM) signal at a first frequency; and
   wherein, to selectively switch the SMPS, the controller circuit is configured to generate a second PWM signal at a second frequency for switching the SMPS, the second frequency being greater than the first frequency.

4. The controller circuit of claim 3, wherein, to generate the second PWM signal, the controller circuit is configured to generate the second PWM signal with a duty cycle that corresponds to the compensation voltage.

5. The controller circuit of claim 1, wherein the compensation element comprises a capacitor.

6. The controller circuit of claim 1, wherein the load comprises a set of light emitting diodes.

7. The controller circuit of claim 1, wherein the controller circuit is configured to operate the SMPS using a plurality of modes.

8. The controller circuit of claim 7, wherein the controller circuit is configured to:
   select a mode from the plurality of modes using the second measured input voltage and an output voltage at the SMPS.

9. The controller circuit of claim 8, wherein, to determine the mode, the controller circuit is configured to:
   select a buck mode in response to the second measured input voltage being greater than the output voltage by a first threshold;
   select a boost mode in response to the second measured input voltage being less than the output voltage by a second threshold; and
   select a buck-boost mode in response to the second measured input voltage being not greater than the output voltage by the first threshold and in response to the second measured input voltage being not less than the output voltage by the second threshold.

10. The controller circuit of claim 1, wherein the load control signal is a first load control signal and wherein the controller circuit is configured to:
   generate a second load control signal corresponding to the first load control signal with a delay; and
   drive, using the second load control signal, a switching element to establish a channel between the load to the SMPS when the second load control signal corresponds to an on state and to refrain from establishing the channel between the load to the SMPS when the second load control signal corresponds to an off state.

11. The controller circuit of claim 1,
wherein, to generate the first measured input voltage, the controller circuit is configured to store the first measured input voltage at a first sampling capacitor;
wherein, to generate the second measured input voltage, the controller circuit is configured to store the second measured input voltage at a second sampling capacitor; and
wherein the controller circuit is further configured to, in response to the load control signal transitioning from the on state to the off state, store a measured output voltage at a third sampling capacitor corresponding to an output voltage at the SMPS.

12. The controller circuit of claim 11, wherein the controller circuit comprises a first current source directly coupled to the compensation element and a second current source directly coupled to the compensation element and wherein, to drive voltage at the compensation element, the controller circuit is configured to:
drive the first current source using a ratio of voltage at the third sampling capacitor and voltage at the first sampling capacitor; and
drive the second current source using a ratio of voltage at the third sampling capacitor and voltage at the second sampling capacitor.

13. The controller circuit of claim 12, wherein, to drive the compensation voltage, the controller circuit is configured to:
drive the first current source to charge the compensation element and drive the second current source to discharge the compensation element; or
drive the first current source to discharge the compensation element and drive the second current source to charge the compensation element.

14. The controller circuit of claim 1,
wherein, to generate the first measured input voltage, the controller circuit is configured to sample the first measured input voltage using an analog-to-digital converter (ADC);
wherein, to generate the second measured input voltage, the controller circuit is configured to sample the second measured input voltage using the ADC;
wherein the controller circuit is further configured to sample, in response to the load control signal transitioning from the on state to the off state, an output voltage at the SMPS using the ADC; and
wherein the controller circuit comprises digital circuitry configured to calculate a target voltage using the sample the first measured input voltage, the sample of the second measured input voltage, and the sample of the output voltage and wherein, to drive the compensation voltage, the controller circuit is configured to drive the compensation voltage to correspond to the target voltage.

15. A method for controlling a switching-mode power supply (SMPS), the method comprising:
receiving, by a controller circuit, a load control signal indicating an on state when a load is to be coupled to the SMPS and an off state when the load is not to be coupled to the SMPS;
in response to the load control signal transitioning from the on state to the off state, generating, by the controller circuit, a first measured input voltage corresponding to an input voltage at the SMPS;
in response to the load control signal transitioning from the off state to the on state, generating, by the controller circuit, a second measured input voltage corresponding to the input voltage at the SMPS;
driving, by the controller circuit, a compensation voltage at a compensation element using the first measured input voltage and the second measured input voltage; and
selectively switching, by the controller circuit, the SMPS using the compensation voltage after driving the compensation voltage.

16. The method of claim 15, further comprising:
in response to the load control signal transitioning from the on state to the off state, generating, by the controller circuit, a measured output voltage corresponding to an output voltage at the SMPS,
wherein driving the compensation voltage comprises driving the compensation voltage using the first measured input voltage, the second measured input voltage, and the measured output voltage.

17. The method of claim 15, wherein the load control signal is a first pulse-width modulated (PWM) signal at a first frequency; and
wherein selectively switching the SMPS comprises generating a second PWM signal at a second frequency for switching the SMPS, the second frequency being greater than the first frequency.

18. The method of claim 17, wherein generating the second PWM signal comprises generating the second PWM signal with a duty cycle that corresponds to the compensation voltage.

19. The method of claim 15, wherein the controller circuit is configured to operate the SMPS using a plurality of modes.

20. A system comprising:
a set of light emitting diodes (LEDs);
a switching-mode power supply (SMPS); and
a controller circuit configured to:
receive a load control signal indicating an on state when the set of LEDs is to be coupled to the SMPS and an off state when the set of LEDs is not to be coupled to the SMPS;
in response to the load control signal transitioning from the on state to the off state, generate a first measured input voltage corresponding to an input voltage at the SMPS;
in response to the load control signal transitioning from the off state to the on state, generate a second measured input voltage corresponding to the input voltage at the SMPS;
drive a compensation voltage at a compensation element using the first measured input voltage and the second measured input voltage; and
selectively switch the SMPS using the compensation voltage after driving the compensation voltage.

* * * * *